(12) United States Patent
Kitada et al.

(10) Patent No.: US 12,304,204 B2
(45) Date of Patent: May 20, 2025

(54) PIEZOELECTRIC BODY, PIEZOELECTRIC ELEMENT, AND LIQUID EJECTION HEAD

(71) Applicant: SEIKO EPSON CORPORATION, Tokyo (JP)

(72) Inventors: Kazuya Kitada, Nagano (JP); Tomohiro Sakai, Nagano (JP); Yasuto Kakemura, Yamanashi (JP)

(73) Assignee: Seiko Epson Corporation, Tokyo (JP)

( * ) Notice: Subject to any disclaimer, the term of this patent is extended or adjusted under 35 U.S.C. 154(b) by 294 days.

(21) Appl. No.: 18/145,883

(22) Filed: Dec. 23, 2022

(65) Prior Publication Data

US 2023/0202175 A1 Jun. 29, 2023

(30) Foreign Application Priority Data

Dec. 27, 2021 (JP) .................. 2021-212446

(51) Int. Cl.
| | |
|---|---|
| *B41J 2/14* | (2006.01) |
| *C01G 33/00* | (2006.01) |
| *H10N 30/00* | (2023.01) |
| *H10N 30/20* | (2023.01) |
| *H10N 30/853* | (2023.01) |

(52) U.S. Cl.
CPC ........ *B41J 2/14201* (2013.01); *C01G 33/006* (2013.01); *H10N 30/2047* (2023.02); *H10N 30/708* (2024.05); *H10N 30/8542* (2023.02); *C01P 2002/34* (2013.01); *C01P 2002/77* (2013.01); *C01P 2002/82* (2013.01); *C01P 2006/40* (2013.01)

(58) Field of Classification Search
CPC ......... B41J 2/14; B41J 2/14233; C01G 33/00; H10N 30/00; H10N 30/8554; H01G 4/14; G01N 21/65; C08K 3/22; G01J 3/44
See application file for complete search history.

(56) References Cited

U.S. PATENT DOCUMENTS

| | | | |
|---|---|---|---|
| 2004/0169854 A1* | 9/2004 | Vo-Dinh ................ | G01N 21/65 356/301 |
| 2007/0126313 A1* | 6/2007 | Ueno .................. | H03H 9/02031 310/311 |
| 2010/0085403 A1* | 4/2010 | Miyazawa ........... | B41J 2/14233 310/365 |
| 2010/0149285 A1* | 6/2010 | Kato ........................ | B41J 2/055 347/71 |
| 2011/0273517 A1* | 11/2011 | Miyazawa ............. | B41J 2/1646 347/68 |

(Continued)

FOREIGN PATENT DOCUMENTS

JP 2012-139923 A 7/2012

*Primary Examiner* — John Zimmermann
(74) *Attorney, Agent, or Firm* — Global IP Counselors, LLP

(57) ABSTRACT

A piezoelectric body contains potassium, sodium, and niobium, and has a perovskite structure. A Raman shift of peaks assigned to $A_{1g}$ obtained by performing Raman spectroscopic analysis on a plurality of measurement regions is 400 $cm^{-1}$ or more and 700 $cm^{-1}$ or less. A difference between a maximum value and a minimum value of the Raman shift among the peaks in the plurality of measurement regions is 11.0 $cm^{-1}$ or less.

6 Claims, 5 Drawing Sheets

(56) References Cited

U.S. PATENT DOCUMENTS

| | | | | |
|---|---|---|---|---|
| 2014/0145555 A1* | 5/2014 | Kurachi | ............ | A61B 5/02444 |
| | | | | 310/311 |
| 2016/0133825 A1* | 5/2016 | Oishi | ................ | H10N 30/2047 |
| | | | | 310/357 |
| 2019/0189898 A1* | 6/2019 | Sieber | .................. | H10N 30/857 |
| 2020/0028066 A1* | 1/2020 | Shibata | ............... | H10N 30/704 |
| 2021/0408361 A1* | 12/2021 | Hamada | ............. | H10N 30/2047 |
| 2023/0115761 A1* | 4/2023 | Narubayashi | ......... | B32B 27/306 |
| | | | | 428/328 |

* cited by examiner

PIEZOELECTRIC BODY, PIEZOELECTRIC ELEMENT, AND LIQUID EJECTION HEAD

The present application is based on, and claims priority from JP Application Serial Number 2021-212446, filed Dec. 27, 2021, the disclosure of which is hereby incorporated by reference herein in its entirety.

BACKGROUND

1. Technical Field

The present disclosure relates to a piezoelectric body, a piezoelectric element, and a liquid ejection head.

2. Related Art

A piezoelectric element used in a liquid ejection head is formed by sandwiching a piezoelectric body made of a piezoelectric material having an electromechanical conversion function between two electrodes. A potassium sodium niobate-based piezoelectric material is known as the piezoelectric material.

In the potassium sodium niobate-based piezoelectric body, cracks may be likely to occur during manufacturing, particularly when a piezoelectric body having a large thickness is formed.

For example, JP-A-2012-139923 discloses a piezoelectric element including an intermediate layer formed, by a vapor phase growth method, between a first piezoelectric layer and a second piezoelectric layer formed by a CSD method, thereby reducing a residual stress of the piezoelectric layer and preventing occurrence of cracks. Specifically, in Examples of JP-A-2012-139923, a composite oxide having a composition as a mixed crystal of KNN and BFO is used as the first piezoelectric layer and the second piezoelectric layer, and Pt is used as the intermediate layer.

However, in the piezoelectric element disclosed in JP-A-2012-139923, the intermediate layer made of a material different from those of the first piezoelectric layer and the second piezoelectric layer is provided between the first piezoelectric layer and the second piezoelectric layer. Therefore, a crystal structure of the second piezoelectric layer may vary depending on plane orientation of a surface, a crystal grain size, and precipitates of the intermediate layer. Accordingly, the crystal structure of the second piezoelectric layer in an in-plane direction may vary. When the crystal structure of the second piezoelectric layer varies, piezoelectric characteristics of the piezoelectric body vary, and quality is impaired.

Therefore, there is a demand for a potassium sodium niobate-based piezoelectric body that does not include an intermediate layer and in which cracks are less likely to occur.

SUMMARY

A piezoelectric body according to an aspect of the present disclosure contains potassium, sodium, and niobium, and has a perovskite structure. A Raman shift of peaks assigned to $A_{1g}$ obtained by performing Raman spectroscopic analysis on a plurality of measurement regions is 400 $cm^{-1}$ or more and 700 $cm^{-1}$ or less. A difference between a maximum value and a minimum value of the Raman shift among the peaks in the plurality of measurement regions is 11.0 $cm^{-1}$ or less.

A piezoelectric element according to an aspect of the present disclosure includes: a first electrode provided on a base; the piezoelectric body provided on the first electrode; and a second electrode provided on the piezoelectric body.

A liquid ejection head according to an aspect of the present disclosure includes: the piezoelectric element; the base; and a nozzle plate having a nozzle hole. The base includes a flow path formation substrate provided with a pressure generation chamber whose volume is changed by the piezoelectric element. The nozzle hole communicates with the pressure generation chamber.

DESCRIPTION OF EXEMPLARY EMBODIMENTS

Hereinafter, a preferred embodiment of the present disclosure will be described in detail with reference to the drawings. The embodiment to be described below does not unduly limit the scope of the present disclosure described in the claims. In addition, not all configurations to be described below are necessarily essential components of the present disclosure.

1. Piezoelectric Element 1.1. Configuration

Figure 1:
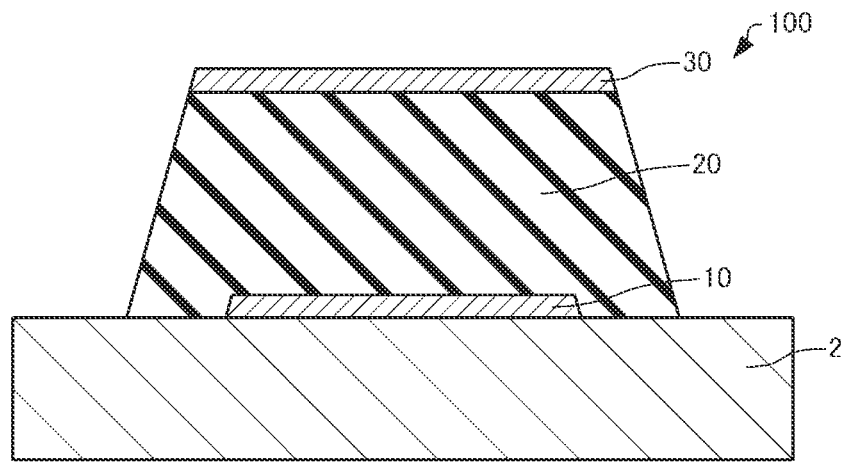
FIG. 1 is a cross-sectional view schematically showing a piezoelectric element according to the present embodiment.

First, a piezoelectric element according to the present embodiment will be described with reference to the drawings. FIG. 1 is a cross-sectional view schematically showing a piezoelectric element 100 according to the present embodiment.

As shown in FIG. 1, the piezoelectric element 100 includes a first electrode 10, a piezoelectric body 20, and a second electrode 30. The piezoelectric element 100 is provided on a base 2.

The base 2 is a flat plate formed of a semiconductor, an insulator, or the like. The base 2 may be a single layer or a laminate in which a plurality of layers are laminated. An internal structure of the base 2 is not limited as long as an upper surface has a planar shape, and the base 2 may have a structure having a space or the like formed therein.

The base 2 may include a vibration plate having flexibility and deformed by an operation of the piezoelectric body 20. The vibration plate is, for example, a silicon oxide layer, a zirconium oxide layer, or a laminate in which a zirconium oxide layer is provided on a silicon oxide layer.

The first electrode 10 is provided on the base 2. The first electrode 10 is provided between the base 2 and the piezoelectric body 20. The first electrode 10 has, for example, a layer shape. A thickness of the first electrode 10 is, for example, 3 nm or more and 300 nm or less. The first electrode 10 is, for example, a metal layer such as a platinum layer, an iridium layer, a titanium layer, or a ruthenium layer, a conductive oxide layer thereof, a lanthanum nickelate ($LaNiO_3$: LNO) layer, or a strontium ruthenate ($SrRuO_3$: SRO) layer. The first electrode 10 may have a structure in which a plurality of layers exemplified above are laminated.

The first electrode 10 is one electrode for applying a voltage to the piezoelectric body 20. The first electrode 10 is a lower electrode provided below the piezoelectric body 20.

Although not shown, an adhesion layer may be provided between the base 2 and the first electrode 10 in order to improve adhesion between the base 2 and the first electrode 10. The adhesion layer is, for example, a titanium layer or a titanium oxide layer.

The piezoelectric body 20 is provided on the first electrode 10. The piezoelectric body 20 is provided between the first electrode 10 and the second electrode 30. Although not shown, the piezoelectric body 20 may be provided on the first electrode 10 and the base 2. The piezoelectric body 20 has a layer shape. The piezoelectric body 20 is formed by laminating a plurality of crystal layers. A thickness of the piezoelectric body 20 is, for example, 100 nm or more and 3 μm or less, and preferably 200 nm or more and 2 μm or less. The piezoelectric body 20 can be deformed by applying a voltage between the first electrode 10 and the second electrode 30.

The piezoelectric body 20 has a perovskite structure. A crystal structure of the piezoelectric body 20 is, for example, a tetragonal system. The piezoelectric body 20 is, for example, a potassium sodium niobate (KNN) layer containing potassium (K), sodium (Na), and niobium (Nb). The piezoelectric body 20 may be a KNN layer added with an additive such as manganese (Mn).

For example, the piezoelectric body 20 is preferentially oriented in a (100) plane. "Preferential orientation" means that 70% or more, preferably 80% or more of crystals are oriented in a predetermined crystal plane. "Preferentially oriented in the (100) plane" includes a case where all the crystals of the piezoelectric body 20 are oriented in the (100) plane and a case where 70% or more, preferably 80% or more of the crystals are oriented in the (100) plane.

The piezoelectric body 20 does not include an intermediate layer. The "intermediate layer" refers to a layer whose main component is made of a material different from that of a main component of a portion constituting the piezoelectric body 20 other than the intermediate layer. For example, when a main component of the piezoelectric body 20 is KNN, the main component of the intermediate layer is not KNN. The "main component" means a material that accounts for 50% by mass or more of a content.

The second electrode 30 is provided on the piezoelectric body 20. Although not shown, the second electrode 30 may be further provided on a side surface of the piezoelectric body 20 and the base 2 as long as the second electrode 30 is electrically separated from the first electrode 10.

The second electrode 30 has, for example, a layer shape. A thickness of the second electrode 30 is, for example, 3 nm or more and 300 nm or less. The second electrode 30 is, for example, a metal layer such as an iridium layer, a platinum layer, a titanium layer, or a ruthenium layer, a conductive oxide layer thereof, a lanthanum nickelate layer, or a strontium ruthenate layer. The second electrode 30 may have a structure in which a plurality of layers exemplified above are laminated.

The second electrode 30 is the other electrode for applying a voltage to the piezoelectric body 20. The second electrode 30 is an upper electrode provided on the piezoelectric body 20.

1.2. Raman Spectroscopic Analysis

A Raman shift of peaks assigned to $A_{1g}$ obtained by performing Raman spectroscopic analysis on a plurality of measurement regions of the piezoelectric body 20 is 400 $cm^{-1}$ or more and 700 $cm^{-1}$ or less, preferably 500 $cm^{-1}$ or more and 650 $cm^{-1}$ or less, more preferably 600 $cm^{-1}$ or more and 610 $cm^{-1}$ or less, and even more preferably 601 $cm^{-1}$ or more and 607 $cm^{-1}$ or less. The measurement region to be measured by Raman spectroscopic analysis is, for example, a region on an upper surface of the piezoelectric body 20. The plurality of measurement regions to be measured by Raman spectroscopic analysis may be linearly arranged in a plan view.

A difference $\Delta$ between the maximum value and the minimum value of the Raman shift among the peaks in the plurality of measurement regions of the piezoelectric body 20 is 11.0 $cm^{-1}$ or less, preferably 7.0 $cm^{-1}$ or less, more preferably 5.0 $cm^{-1}$ or less, and even more preferably 4.5 $cm^{-1}$ or less. The difference $\Delta$ may be larger than 0.0 $cm^{-1}$ or may be 0.0 $cm^{-1}$.

A standard deviation $\sigma$ of the Raman shift among the peaks in the plurality of measurement regions of the piezoelectric body 20 is, for example, 2 $cm^{-1}$ or less, preferably 1.5 $cm^{-1}$ or less, and more preferably 1.0 $cm^{-1}$ or less. The standard deviation $\sigma$ may be larger than 0.0 $cm^{-1}$ or may be 0.0 $cm^{-1}$.

1.3. Operational Effects

The piezoelectric body 20 contains potassium, sodium, and niobium, and has a perovskite structure. The Raman shift of the peaks assigned to $A_{1g}$ obtained by performing Raman spectroscopic analysis on the plurality of measurement regions is 400 $cm^{-1}$ or more and 700 $cm^{-1}$ or less. The difference $\Delta$ between the maximum value and the minimum value of the Raman shift among the peaks in the plurality of measurement regions is 11.0 $cm^{-1}$ or less. Therefore, cracks are less likely to occur in the piezoelectric body 20 as compared with a case where the difference $\Delta$ is larger than 11.0 $cm^{-1}$, as shown in Examples and Comparative Examples to be described later.

Further, the piezoelectric body 20 does not include an intermediate layer. Therefore, in the piezoelectric body 20, it is possible to prevent a variation in piezoelectric characteristics in an in-plane direction of the piezoelectric body due to the intermediate layer. The "in-plane direction" is a direction orthogonal to a thickness direction of the piezoelectric body 20.

As described above, since the piezoelectric body 20 does not include an intermediate layer, cracks are less likely to occur.

The piezoelectric body 20 may be preferentially oriented in the (100) plane. Cracks are less likely to occur in the piezoelectric body 20 preferentially oriented in the (100) plane than in a piezoelectric body preferentially oriented in a plane other than the (100) plane. Therefore, the thickness of the piezoelectric body 20 can be increased.

In the piezoelectric body 20, the difference $\Delta$ may be 5.0 $cm^{-1}$ or less. Cracks are less likely to occur in the piezoelectric body 20 in which the difference Δ is 5.0 cm$^{-1}$ or less than in a piezoelectric body in which the difference Δ is larger than 5.0 cm$^{-1}$.

2. Method For Manufacturing Piezoelectric Element

Next, a method for manufacturing the piezoelectric element 100 according to the present embodiment will be described with reference to the drawings.

As shown in FIG. 1, the base 2 is prepared. Specifically, a silicon oxide layer is formed by thermally oxidizing a silicon substrate. Next, a zirconium layer is formed on the silicon oxide layer by a sputtering method or the like, and the zirconium layer is thermally oxidized to form a zirconium oxide layer. Accordingly, a vibration plate including the silicon oxide layer and the zirconium oxide layer can be formed. The base 2 can be prepared through the above steps.

Next, the first electrode 10 is formed on the base 2. An adhesion layer such as a titanium layer or a titanium oxide layer may be formed between the base 2 and the first electrode 10 in order to improve adhesion between the base 2 and the first electrode 10. The first electrode 10 is formed by, for example, a sputtering method or a vacuum deposition method. Next, the first electrode 10 is patterned. The patterning is performed by, for example, photolithography and etching.

Next, the piezoelectric body 20 is formed on the first electrode 10. The piezoelectric body 20 is formed by a chemical solution deposition (CSD) method such as a sol-gel method or metal organic deposition (MOD). Hereinafter, a method for forming the piezoelectric body 20 will be described.

First, for example, a metal complex containing potassium, a metal complex containing sodium, a metal complex containing niobium, and a metal complex containing manganese are dissolved or dispersed in an organic solvent to prepare a precursor solution.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, pentaethoxy niobium, and pentabutoxy niobium. Examples of the metal complex containing manganese include manganese 2-ethylhexanoate. Two or more metal complexes may be used in combination. For example, potassium 2-ethylhexanoate and potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, and mixed solvents thereof.

Next, the prepared precursor solution is applied onto the first electrode 10 using a spin coating method or the like to form a precursor layer. Next, the precursor layer is heated at, for example, 130° C. or higher and 250° C. or lower and dried for a certain period of time, and the dried precursor layer is heated at, for example, 300° C. or higher and 450° C. or lower and held for a certain period of time to be degreased. Next, the degreased precursor layer is crystallized by firing at, for example, 550° C. or higher and 800° C. or lower to form a crystal layer.

Then, a series of steps from the application of the precursor solution to the firing of the precursor layer are repeated a plurality of times. Accordingly, the piezoelectric body 20 including a plurality of crystal layers can be formed.

Next, the piezoelectric body 20 is patterned. The patterning is performed by, for example, photolithography and etching.

A heating device used for drying and degreasing the precursor layer is, for example, a hot plate. The heating device used for firing the precursor layer is, for example, a rapid thermal annealing (RTA) device.

Next, the second electrode 30 is formed on the piezoelectric body 20. The second electrode 30 is formed by, for example, a sputtering method or a vacuum deposition method. Next, the second electrode 30 is patterned. The patterning is performed by, for example, photolithography and etching.

The piezoelectric element 100 can be manufactured through the above steps.

The second electrode 30 and the piezoelectric body 20 may be patterned in the same step. The first crystal layer of the piezoelectric body 20 and the first electrode 10 may be patterned in the same step.

3. Modification of Piezoelectric Element

Figure 2:
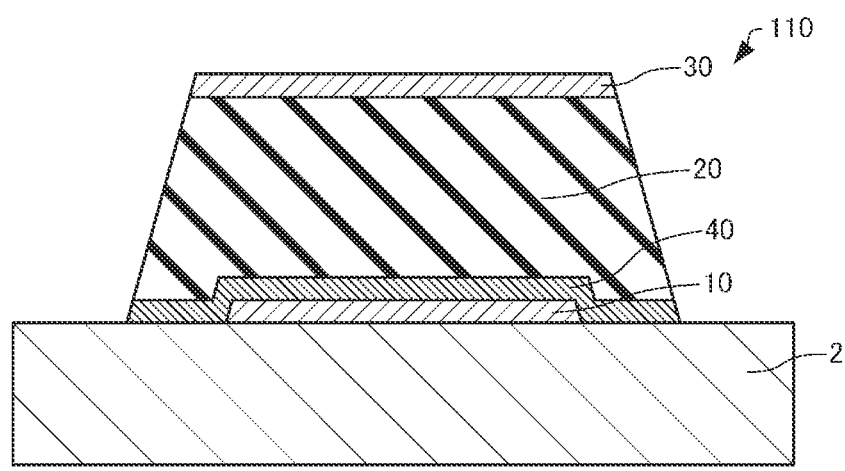
FIG. 2 is a cross-sectional view schematically showing a piezoelectric element according to a modification of the present embodiment.

Next, a piezoelectric element according to a modification of the present embodiment will be described with reference to the drawings. FIG. 2 is a cross-sectional view schematically showing a piezoelectric element 110 according to the modification of the present embodiment. Hereinafter, in the piezoelectric element 110 according to the modification of the present embodiment, members having the same functions as those of components of the piezoelectric element 100 according to the present embodiment described above are denoted by the same reference numerals, and detailed description thereof will be omitted.

As shown in FIG. 2, the piezoelectric element 110 is different from the piezoelectric element 100 described above in that the piezoelectric element 110 includes a seed layer 40.

The seed layer 40 is provided between the first electrode 10 and the piezoelectric body 20. The seed layer 40 is provided on the first electrode 10. In the shown example, the seed layer 40 is also provided on the base 2. Although not shown, the seed layer 40 may be provided only on the first electrode 10. The seed layer 40 is, for example, an oxide containing bismuth (Bi), iron (Fe), titanium (Ti), or lead (Pb). The seed layer 40 may be bismuth ferrate titanate added with lead. The seed layer 40 is a layer that controls orientation of the piezoelectric body 20.

The seed layer 40 is formed by, for example, a sputtering method, a vacuum deposition method, or a solution method. The seed layer 40 and the piezoelectric body 20 may be patterned in the same step.

The piezoelectric element 110 includes the seed layer 40 provided between the first electrode 10 and the piezoelectric body 20. Therefore, the orientation of the piezoelectric body 20 can be improved in the piezoelectric element 110 as compared with a case where the seed layer 40 is not provided, for example. Specifically, the orientation of the piezoelectric body 20 in the (100) plane can be improved.

4. Liquid Ejection Head

Figure 3:
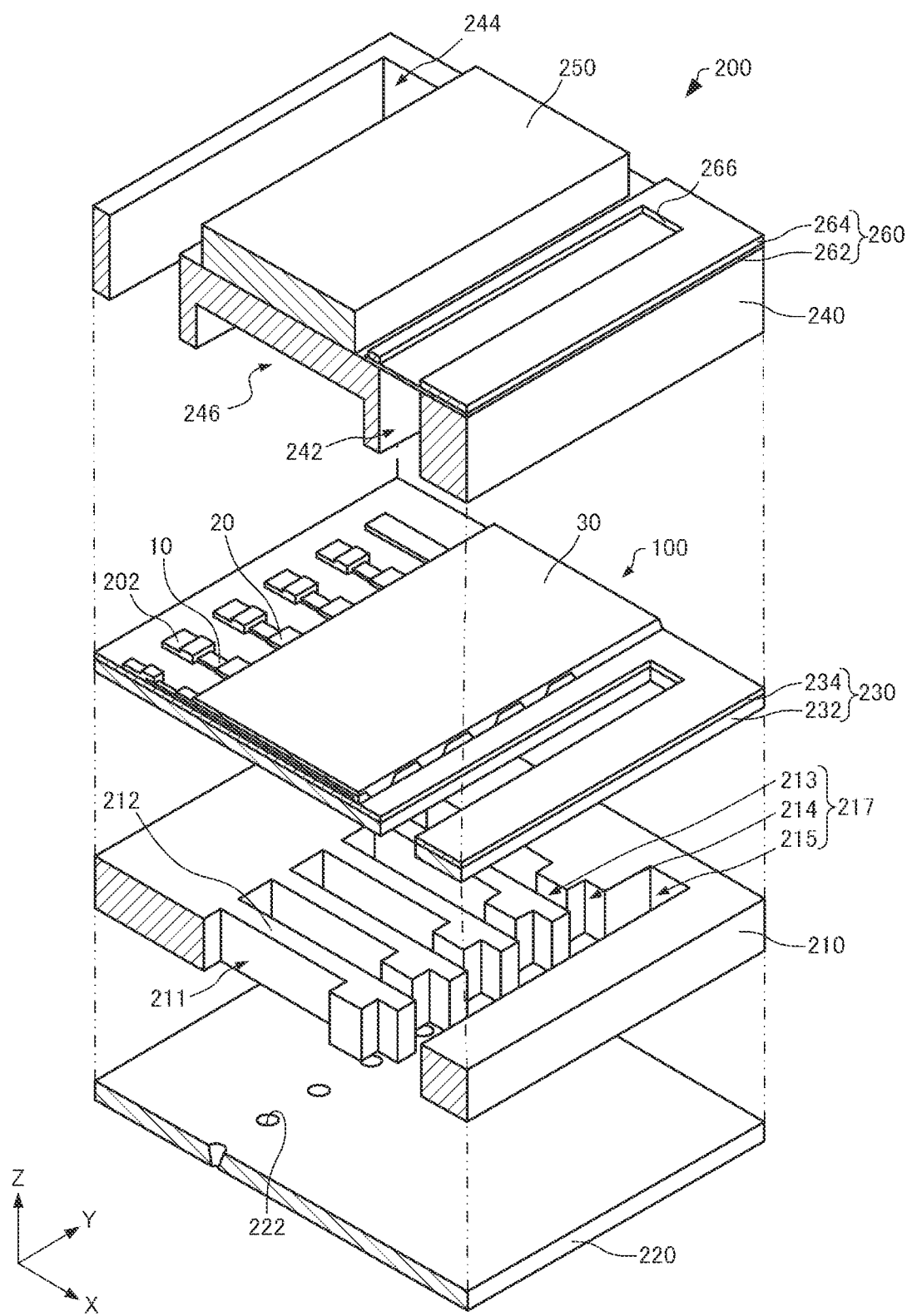
FIG. 3 is an exploded perspective view schematically showing a liquid ejection head according to the present embodiment.
Figure 4:
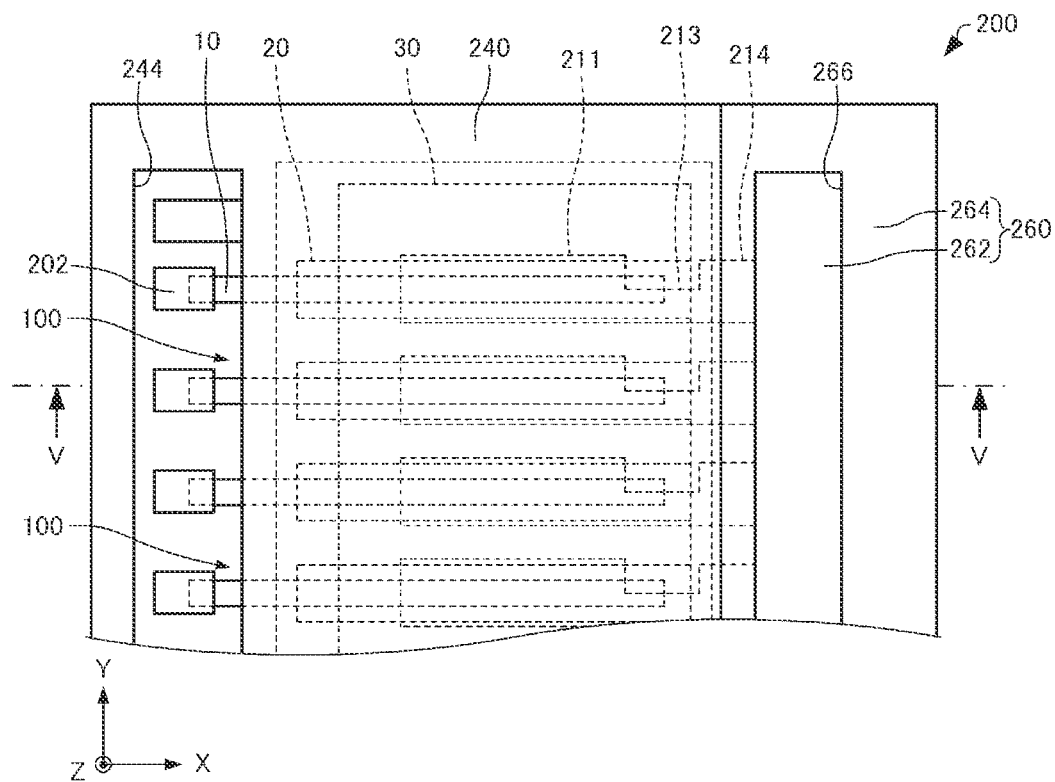
FIG. 4 is a plan view schematically showing the liquid ejection head according to the present embodiment.
Figure 5:
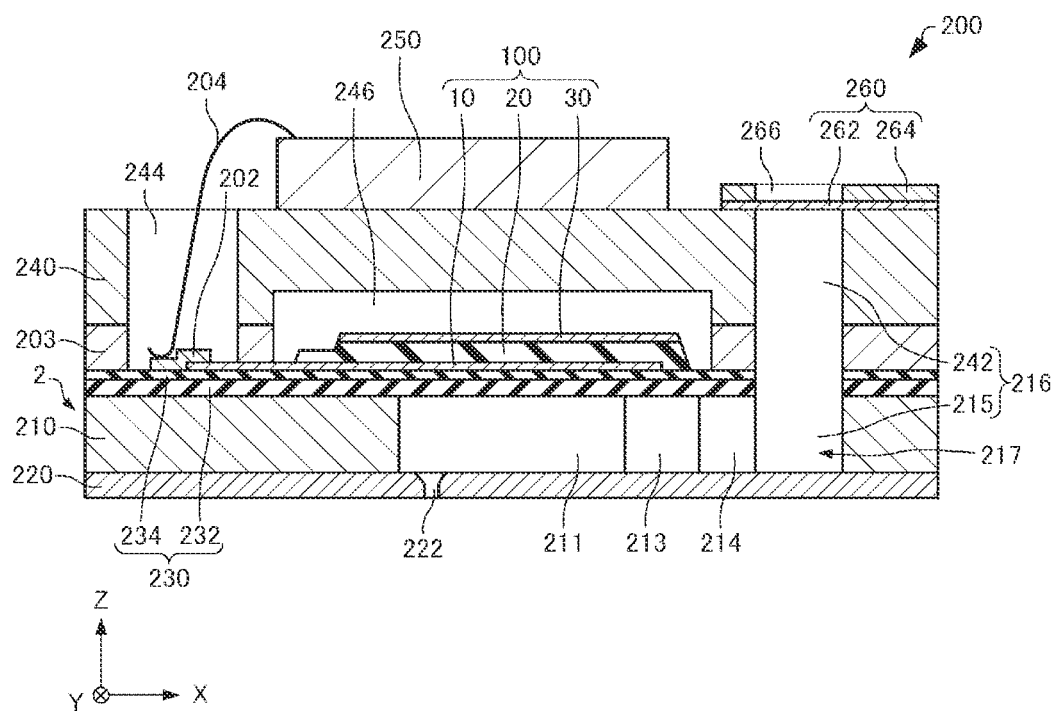
FIG. 5 is a cross-sectional view schematically showing the liquid ejection head according to the present embodiment.

Next, a liquid ejection head according to the present embodiment will be described with reference to the drawings. FIG. 3 is an exploded perspective view schematically showing a liquid ejection head 200 according to the present embodiment. FIG. 4 is a plan view schematically showing the liquid ejection head 200 according to the present embodiment. FIG. 5 is a cross-sectional view taken along a line V-V in FIG. 4, schematically showing the liquid ejection head 200 according to the present embodiment. FIGS. 3 to 5 show an X axis, a Y axis, and a Z axis as three axes orthogonal to each other. FIGS. 3 and 5 show the piezoelectric element 100 in a simplified manner.

As shown in FIGS. 3 to 5, the liquid ejection head 200 includes, for example, the base 2, the piezoelectric element 100, a nozzle plate 220, a protective substrate 240, a circuit board 250, and a compliance substrate 260. The base 2 includes a flow path formation substrate 210 and a vibration plate 230. The circuit board 250 is not shown in FIG. 4 for convenience.

The flow path formation substrate 210 is, for example, a silicon substrate. Pressure generation chambers 211 are provided in the flow path formation substrate 210. The pressure generation chambers 211 are partitioned by a plurality of partition walls 212. A volume of the pressure generation chambers 211 is changed by the piezoelectric element 100.

First communication paths 213 and second communication paths 214 are provided at an end of the flow path formation substrate 210 in a +X-axis direction of the pressure generation chambers 211. The first communication path 213 reduces an opening area of the pressure generation chamber 211 by narrowing, from a Y-axis direction, an end of the pressure generation chamber 211 in the +X-axis direction. A width of the second communication path 214 in the Y-axis direction is, for example, the same as a width of the pressure generation chamber 211 in the Y-axis direction. A third communication path 215 communicating with the plurality of second communication paths 214 is provided in the +X-axis direction of the second communication paths 214. The third communication path 215 constitutes a part of a manifold 216. The manifold 216 serves as a liquid chamber common to the pressure generation chambers 211. In this way, the flow path formation substrate 210 is provided with the pressure generation chambers 211, and a supply flow path 217 including the first communication paths 213, the second communication paths 214, and the third communication path 215. The supply flow path 217 communicates with the pressure generation chambers 211 and supplies liquid to the pressure generation chambers 211.

The nozzle plate 220 is provided on a surface on one side of the flow path formation substrate 210. A material of the nozzle plate 220 is, for example, steel use stainless (SUS). The nozzle plate 220 is bonded to the flow path formation substrate 210 by, for example, an adhesive or a thermal welding film. The nozzle plate 220 has a plurality of nozzle holes 222 along the Y axis. The nozzle hole 222 communicates with the pressure generation chamber 211 and ejects liquid.

The vibration plate 230 is provided on a surface on the other side of the flow path formation substrate 210. The vibration plate 230 includes, for example, a silicon oxide layer 232 provided on the flow path formation substrate 210 and a zirconium oxide layer 234 provided on the silicon oxide layer 232.

The piezoelectric element 100 is provided on the vibration plate 230, for example. A plurality of piezoelectric elements 100 are provided. The number of piezoelectric elements 100 is not particularly limited.

In the liquid ejection head 200, the vibration plate 230 and the first electrode 10 are displaced by deformation of the piezoelectric body 20 having electromechanical conversion characteristics. That is, in the liquid ejection head 200, the vibration plate 230 and the first electrode 10 substantially function as a vibration plate.

The first electrode 10 is formed as an individual electrode that is independent for each pressure generation chamber 211. A width of the first electrode 10 in the Y-axis direction is narrower than the width of the pressure generation chamber 211 in the Y-axis direction. A length of the first electrode 10 in an X-axis direction is longer than a length of the pressure generation chamber 211 in the X-axis direction. Both ends of the first electrode 10 are located so as to sandwich both ends of the pressure generation chamber 211 in the X-axis direction. A lead electrode 202 is coupled to an end of the first electrode 10 in a −X-axis direction.

A width of the piezoelectric body 20 in the Y-axis direction is, for example, wider than the width of the first electrode 10 in the Y-axis direction. A length of the piezoelectric body 20 in the X-axis direction is, for example, longer than the length of the pressure generation chamber 211 in the X-axis direction. An end of the first electrode 10 in the +X-axis direction is located, for example, between an end of the piezoelectric body 20 in the +X-axis direction and the end of the pressure generation chamber 211 in the +X-axis direction. The end of the first electrode 10 in the +X-axis direction is covered with the piezoelectric body 20. On the other hand, an end of the piezoelectric body 20 in the −X-axis direction is located, for example, between the end of the first electrode 10 in the −X-axis direction and the end of the pressure generation chamber 211 in the +X-axis direction. The end of the first electrode 10 in the −X-axis direction is not covered with the piezoelectric body 20.

For example, the second electrode 30 is provided continuously on the piezoelectric body 20 and the vibration plate 230. The second electrode 30 is formed as a common electrode common to the plurality of piezoelectric elements 100.

The protective substrate 240 is bonded to the vibration plate 230 by an adhesive 203. The protective substrate 240 has a through hole 242. In the shown example, the through hole 242 penetrates the protective substrate 240 in a Z-axis direction and communicates with the third communication path 215. The through hole 242 and the third communication path 215 constitute the manifold 216 serving as the liquid chamber common to the pressure generation chambers 211. The protective substrate 240 further has a through hole 244 penetrating the protective substrate 240 in the Z-axis direction. An end of the lead electrode 202 is located in the through hole 244.

An opening 246 is provided in the protective substrate 240. The opening 246 is a space for avoiding interference with driving of the piezoelectric element 100. The opening 246 may or may not be sealed.

The circuit board 250 is provided on the protective substrate 240. The circuit board 250 includes an integrated circuit (IC) for driving the piezoelectric element 100. The circuit board 250 and the lead electrode 202 are electrically coupled to each other via a coupling wiring 204.

The compliance substrate 260 is provided on the protective substrate 240. The compliance substrate 260 includes a sealing layer 262 provided on the protective substrate 240 and a fixing plate 264 provided on the sealing layer 262. The sealing layer 262 is a layer for sealing the manifold 216. For example, the sealing layer 262 has flexibility. The fixing plate 264 has a through hole 266. The through hole 266 penetrates the fixing plate 264 in the Z-axis direction. The through hole 266 is formed at a position overlapping the manifold 216 when viewed from the Z-axis direction.

5. Printer

Figure 6:
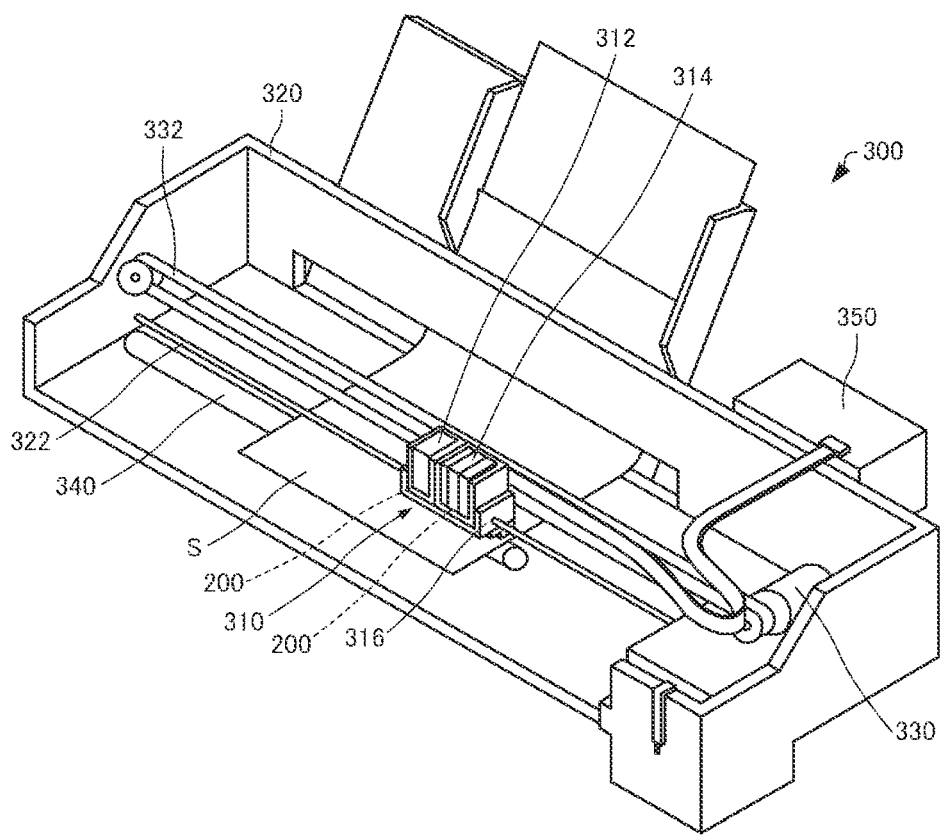
FIG. 6 is a perspective view schematically showing a printer according to the present embodiment.

Next, a printer according to the present embodiment will be described with reference to the drawings. FIG. 6 is a perspective view schematically showing a printer 300 according to the present embodiment.

The printer 300 is an inkjet printer. As shown in FIG. 6, the printer 300 includes a head unit 310. The head unit 310 includes, for example, the liquid ejection head 200. The number of the liquid ejection heads 200 is not particularly limited. The head unit 310 is detachably provided with cartridges 312, 314 constituting a supply unit. A carriage 316 on which the head unit 310 is mounted is movable in an axial direction on a carriage shaft 322 attached to a device main body 320, and ejects liquid supplied from the liquid supply unit.

Here, the liquid may be a material containing a substance in a liquid phase, and also includes a material in a liquid state such as a sol or a gel. In addition to a liquid containing a substance in one state, the liquid also includes one obtained by dissolving, dispersing, or mixing, in a solvent, particles of a solid functional material such as a pigment or metal particles. Typical examples of the liquid include an ink and a liquid crystal emulsifier. The ink includes various liquid compositions such as a general water-based ink, an oil-based ink, a gel ink, and a hot-melt ink.

In the printer 300, a driving force of a drive motor 330 is transmitted to the carriage 316 via a plurality of gears (not shown) and a timing belt 332, whereby the carriage 316 on which the head unit 310 is mounted moves along the carriage shaft 322. On the other hand, the device main body 320 is provided with a conveyance roller 340 serving as a conveyance mechanism that moves a sheet S, which is a recording medium such as paper, relative to the liquid ejection head 200. The conveyance mechanism that conveys the sheet S is not limited to the conveyance roller, and may be a belt, a drum, or the like.

The printer 300 includes a printer controller 350 serving as a control unit that controls the liquid ejection head 200 and the conveyance roller 340. The printer controller 350 is electrically coupled to the circuit board 250 of the liquid ejection head 200. The printer controller 350 includes, for example, a random access memory (RAM) that temporarily stores various data, a read only memory (ROM) that stores a control program and the like, a central processing unit (CPU), and a drive signal generation circuit that generates a drive signal for supply to the liquid ejection head 200.

The piezoelectric element 100 is not limited to a liquid ejection head and a printer, and can be used in a wide range of applications. The piezoelectric element 100 is suitably used as a piezoelectric actuator for, for example, an ultrasonic motor, a vibration type dust removing device, a piezoelectric transformer, a piezoelectric speaker, a piezoelectric pump, or a pressure-electric conversion device. The piezoelectric element 100 is suitably used as a piezoelectric sensor element such as an ultrasonic detector, an angular velocity sensor, an acceleration sensor, a vibration sensor, an inclination sensor, a pressure sensor, a collision sensor, a motion sensor, an infrared sensor, a terahertz sensor, a heat detection sensor, a pyroelectric sensor, or a piezoelectric sensor. The piezoelectric element 100 is suitably used as a ferroelectric element such as a ferroelectric memory (FeRAM), a ferroelectric transistor (FeFET), a ferroelectric arithmetic circuit (FeLogic), or a ferroelectric capacitor. The piezoelectric element 100 is suitably used as a voltage-controlled optical element such as a wavelength converter, an optical waveguide, an optical path modulator, a refractive index control element, or an electronic shutter mechanism.

6. Example and Comparative Example
6.1. Preparation of Sample
6.1.1. Example 1

In Example 1, first, a silicon dioxide layer was formed on a silicon substrate by thermally oxidizing a silicon substrate. Next, a zirconium layer was formed on a silicon dioxide layer by a sputtering method, and the zirconium layer was thermally oxidized to form a zirconium oxide layer. Next, a first electrode was formed on the zirconium oxide layer by a sputtering method. A material of the first electrode was platinum.

Next, $(K_{0.5}Na_{0.5})_{1.04}(Nb_{0.995}Mn_{0.05})O_3$ was prepared using a solution containing potassium 2-ethylhexanoate, sodium 2-ethylhexanoate, niobium 2-ethylhexanoate, and manganese 2-ethylhexanoate, and the solution was applied onto the first electrode by a spin coating method. Next, drying was performed at 180° C., degreasing was performed at 380° C., and a heat treatment was performed at 700° C. for three minutes using an RTA device. Then, steps from the application of the solution to the heat treatment were repeated until cracks occurred in a piezoelectric body. A thickness per layer of a plurality of crystal layers constituting the piezoelectric body was 30 nm.

6.1.2. Comparative Example 1

In Comparative Example 1, a thickness per layer of a plurality of crystal layers constituting a piezoelectric body was 75 nm. Except for this, preparation was performed in the same manner as in Example 1 described above.

6.2. Crack Confirmation

In Example 1 and Comparative Example 1, presence or absence of cracks was confirmed with a phase contrast microscope each time a crystal layer was formed. "OPTIPHOT 200" manufactured by Nikon Corporation was used as the phase contrast microscope. An eyepiece lens was 10 times, and an objective lens was 100 times.

In Example 1, cracks were confirmed when 35 crystal layers were laminated. On the other hand, in Comparative Example 1, cracks were confirmed when ten crystal layers were laminated. When the cracks were confirmed, the lamination of the crystal layers was completed.

6.3. Raman Spectroscopic Analysis

Raman spectroscopic analysis was performed on the piezoelectric bodies of Example 1 and Comparative Example 1 in which the cracks were confirmed. A Raman spectrometer "Nanofinder 30" manufactured by Tokyo Instruments Co., Ltd. was used in the Raman spectroscopic analysis. An excitation wavelength was 325 nm, a focal length was 52 cm, and a diffraction grating was 3600 Lines/mm. A "DU420-BU" manufactured by ANDOR was used as a CCD detector. 45 points were measured linearly with a measurement step of 0.1 µm. One measurement region was measured for 20 seconds.

Figure 7:
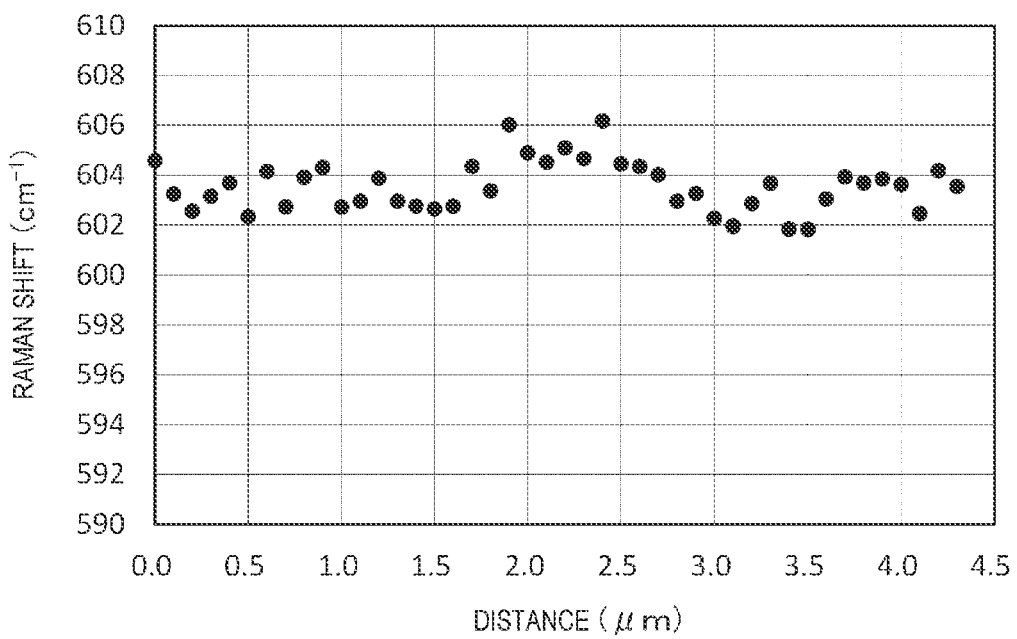
FIG. 7 is a graph showing a Raman shift of peaks assigned to $A_{1g}$ in Example 1.
Figure 8:
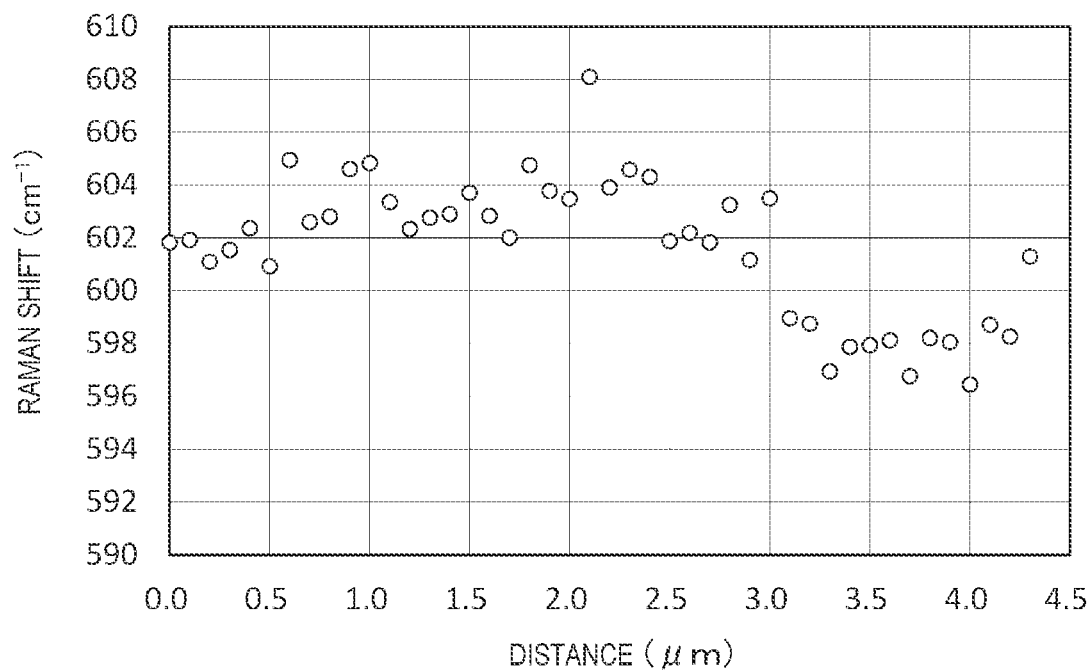
FIG. 8 is a graph showing a Raman shift of peaks assigned to $A_{1g}$ in Comparative Example 1.

Peaks in the vicinity of 600 cm$^{-1}$ obtained by the Raman spectroscopic analysis were separated into peaks assigned to $E_g$ and peaks assigned to $A_{1g}$ by Lorentzian fitting (see Ruio-Macros, Del Campo, and Fernandez J. Appl. Phys. 113, 187215 (2013)). FIG. 7 is a graph showing a Raman shift of peaks assigned to $A_{1g}$ in Example 1. FIG. 8 is a graph showing a Raman shift of peaks assigned to $A_{1g}$ in Comparative Example 1. A horizontal axis in FIGS. 7 and 8 indicates a distance from a first measurement region when a position of the first measurement region is zero. A vertical axis in FIGS. 7 and 8 indicates the Raman shift in the measurement regions.

As shown in FIGS. 7 and 8, variations in Raman shift in a plurality of measurement regions were smaller in Example 1 than in Comparative Example 1.

In Example 1, the maximum value of the Raman shift was 606.2 cm$^{-1}$ in the plurality of measurement regions. The minimum value was 601.8 cm$^{-1}$. A difference between the maximum value and the minimum value was 4.4 cm$^{-1}$. A standard deviation was 0.99 cm$^{-1}$.

In Comparative Example 1, the maximum value of the Raman shift was 608.1 cm$^{-1}$ in the plurality of measurement regions. The minimum value was 596.5 cm$^{-1}$. A difference between the maximum value and the minimum value was 11.6 cm$^{-1}$. A standard deviation was 2.64 cm$^{-1}$.

From this experiment, it is found that cracks are less likely to occur as a difference between the maximum value and the minimum value of the Raman shift in the plurality of measurement regions of the piezoelectric body decreases.

Figure 9:
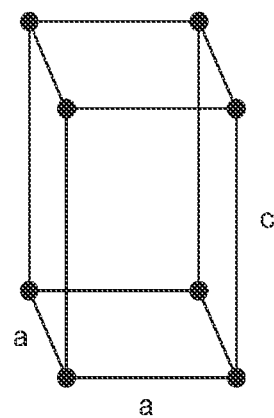
FIG. 9 is a diagram showing a lattice unit of a tetragonal system.

Here, FIG. 9 is a diagram showing a lattice unit of a tetragonal system. The peak assigned to $A_{1g}$ in the vicinity of 600 cm$^{-1}$ is shifted to a lower frequency side as a c axis of the lattice unit is shorter, that is, as the lattice unit is closer to a cubic system, and is shifted to a higher frequency side as the c-axis is longer. When a variation in a length of the c-axis is large, a strong stress is applied to a boundary surface between adjacent lattice units, and characteristics such as a linear expansion coefficient are different, which is considered to be disadvantageous to crack resistance. Therefore, in Comparative Example 1, it is expected that a thickness at which the cracks occur is small. On the other hand, in Example 1, since a variation in a length of the c-axis is small, it is expected that a thickness at which the cracks occur is large.

The embodiment and modification described above are merely examples, and the present disclosure is not limited thereto. For example, the embodiment and the modification may be combined as appropriate.

The present disclosure includes a configuration substantially the same as the configuration described in the embodiment, for example, a configuration having the same function, method, and result, or a configuration having the same object and effect. In addition, the present disclosure includes a configuration obtained by replacing a nonessential portion of the configuration described in the embodiment. In addition, the present disclosure includes a configuration having the same function and effect as the configuration described in the embodiment, or a configuration capable of achieving the same object. In addition, the present disclosure includes a configuration in which a known technique is added to the configuration described in the embodiment.

The following contents are derived from the embodiment and modification described above.

A piezoelectric body according to one aspect contains potassium, sodium, and niobium, and has a perovskite structure. A Raman shift of peaks assigned to $A_{1g}$ obtained by performing Raman spectroscopic analysis on a plurality of measurement regions is 400 cm$^{-1}$ or more and 700 cm$^{-1}$ or less. A difference between a maximum value and a minimum value of the Raman shift among the peaks in the plurality of measurement regions is 11.0 cm$^{-1}$ or less.

According to this piezoelectric body, since the piezoelectric body does not include an intermediate layer, cracks are less likely to occur.

In the piezoelectric body according to the one aspect, the piezoelectric body may be preferentially oriented in a (100) plane.

According to this piezoelectric body, a thickness of the piezoelectric body can be increased.

In the piezoelectric body according to the one aspect, the difference may be 5.0 cm$^{-1}$ or less.

According to this piezoelectric body, cracks are less likely to occur.

A piezoelectric element according to one aspect includes: a first electrode provided on a base; the piezoelectric body provided on the first electrode; and a second electrode provided on the piezoelectric body.

In the piezoelectric element according to the one aspect, a seed layer may be provided between the first electrode and the piezoelectric body.

According to this piezoelectric element, orientation of the piezoelectric body can be improved.

A liquid ejection head according to one aspect includes: the piezoelectric element; the base; and a nozzle plate having a nozzle hole. The base includes a flow path formation substrate provided with a pressure generation chamber whose volume is changed by the piezoelectric element. The nozzle hole communicates with the pressure generation chamber.

What is claimed is:

1. A piezoelectric body having a perovskite structure, comprising:
   potassium;
   sodium; and
   niobium, wherein
   Raman shifts of peaks which are assigned to $A_{1g}$ and are obtained for a plurality of measurement regions of the piezoelectric body, respectively, by performing Raman spectroscopic analysis on the plurality of measurement regions are 600 cm$^{-1}$ or more and 610 cm$^{-1}$ or less, and
   a difference between a maximum Raman shift value among the Raman shifts of the peaks and a minimum Raman shift value among the Raman shifts of the peaks in the plurality of measurement regions is 4.5 cm$^{-1}$ or less.

2. The piezoelectric body according to claim 1, wherein the piezoelectric body is preferentially oriented in a (100) plane.

3. A piezoelectric element comprising:
   a first electrode provided on a base;
   the piezoelectric body according to claim 1, the piezoelectric body being provided on the first electrode; and
   a second electrode provided on the piezoelectric body.

4. The piezoelectric element according to claim 3, further comprising:
   a seed layer provided between the first electrode and the piezoelectric body.

5. A liquid ejection head comprising:
   the piezoelectric element according to claim 4;
   the base; and
   a nozzle plate having a nozzle hole, wherein
   the base includes a flow path formation substrate provided with a pressure generation chamber whose volume is changed by the piezoelectric element, and
   the nozzle hole communicates with the pressure generation chamber.

6. The piezoelectric body according to claim 1, wherein a standard deviation o of the Raman shifts of the peaks for the plurality of measurement regions is 2 cm$^{-1}$ or less.

* * * * *